United States Patent [19]

Oh

[11] Patent Number: 5,610,082

[45] Date of Patent: Mar. 11, 1997

[54] METHOD FOR FABRICATING THIN FILM TRANSISTOR USING BACK LIGHT EXPOSURE

[75] Inventor: Eui Y. Oh, Kyungki-do, Rep. of Korea

[73] Assignee: LG Electronics Inc., Seoul, Rep. of Korea

[21] Appl. No.: 174,208

[22] Filed: Dec. 28, 1993

[30] Foreign Application Priority Data

Dec. 29, 1992 [KR] Rep. of Korea ................. 1992/26230
Dec. 29, 1992 [KR] Rep. of Korea ................. 1992/26233
Jan. 11, 1993 [KR] Rep. of Korea ................... 1993/263

[51] Int. Cl.$^6$ .................................................. H01L 21/84
[52] U.S. Cl. ........................... 437/21; 437/40; 437/42; 437/978; 148/DIG. 43; 430/319
[58] Field of Search ........................... 437/41, 42, 101, 437/21, 909, 40 TFI, 41 TFI, 235, 978; 148/DIG. 43; 430/311, 313, 314, 319

[56] References Cited

U.S. PATENT DOCUMENTS

| | | | |
|---|---|---|---|
| 4,778,773 | 10/1988 | Sukegawa et al. | 437/43 |
| 4,943,837 | 7/1990 | Konishi et al. | |
| 4,960,719 | 10/1990 | Tanaka et al. | 437/43 |
| 5,028,551 | 7/1991 | Dohjo et al. | 437/41 |
| 5,041,888 | 8/1991 | Possin et al. | |
| 5,045,753 | 9/1991 | Katayama et al. | 313/494 |
| 5,071,779 | 12/1991 | Tanaka et al. | 437/101 |
| 5,091,337 | 2/1992 | Watanabe et al. | 437/41 |
| 5,137,841 | 8/1992 | Takeda et al. | 437/41 |
| 5,243,202 | 9/1993 | Mori et al. | |
| 5,248,630 | 9/1993 | Serikawa et al. | |
| 5,254,488 | 10/1993 | Haller | 437/41 |
| 5,306,653 | 4/1994 | Hur | 437/40 TFI |
| 5,326,712 | 7/1994 | Bae | 437/40 |
| 5,371,025 | 12/1994 | Sung | 437/41 |
| 5,374,570 | 12/1994 | Nasu et al. | 437/40 |

FOREIGN PATENT DOCUMENTS

| | | | |
|---|---|---|---|
| 3-16214 | 1/1991 | Japan | 437/237 |
| 3149883 | 6/1991 | Japan | |
| 4-3469 | 1/1992 | Japan | |
| 4-186734 | 7/1992 | Japan | |
| 4307941 | 10/1992 | Japan | 437/41 |
| 4-304677 | 10/1992 | Japan | 437/101 |

OTHER PUBLICATIONS

S. Wolf & R. N. Tauber "Silicon Proc. For the VLSI Era" vol. I, p. 308, 1986.
S. Wolf & R. N. Tauber, "Silicon Proc. For the VLSI Era", vol. I, 1986, pp. 531–533, 550–553, 556–557, 546, 581.

*Primary Examiner*—Charles L. Bowers, Jr.
*Assistant Examiner*—Leon Radomsky
*Attorney, Agent, or Firm*—Morgan, Lewis and Bockius LLP

[57] ABSTRACT

A method for fabricating a thin film transistor, enabling an easy fabrication and an improvement in device characteristic by use of a self-alignment. The method including the steps of forming a gate electrode on an insulating transparent substrate, depositing a plurality of gate insulating films having different refractive indexes, in the order of higher refractive index, and then a semiconductor layer, an etch stopper layer and a photoresist film, in this order, subjecting the resulting structure to a back light exposure using the gate electrode as a mask and then to a development for patterning the photoresist film so that the gate electrode can be overlapped by a predetermined overlap length with each of a source electrode and a drain electrode to be formed at a subsequent step, selectively etching the etch stopper layer using the patterned photoresist film as a mask, removing the patterned photoresist film and then sequentially depositing a high concentration n type doped semiconductor layer and a metal layer over the entire exposed surface of the resulting structure, and selectively removing respective portions of the high concentration n type doped semiconductor layer and the metal layer disposed over the patterned etch stopper layer to form the source electrode and the drain electrode.

10 Claims, 11 Drawing Sheets

FIG.6
|  | refractive index |  | refractive index |
|---|---|---|---|
| $SiN_4$ | 2.0 | $TiO_2$ | 3.0 |
| $Al_2O_3$ | 1.7 | SO | 2.0 |
| $SiO_2$ | 1.5 | $H+O_2$ | 1.9 |
| $Ta_2O_5$ | 2.5 | 9lan | 1.5 |
| $Nb_2O_5$ | 2.5 |  |  |
FIG.7
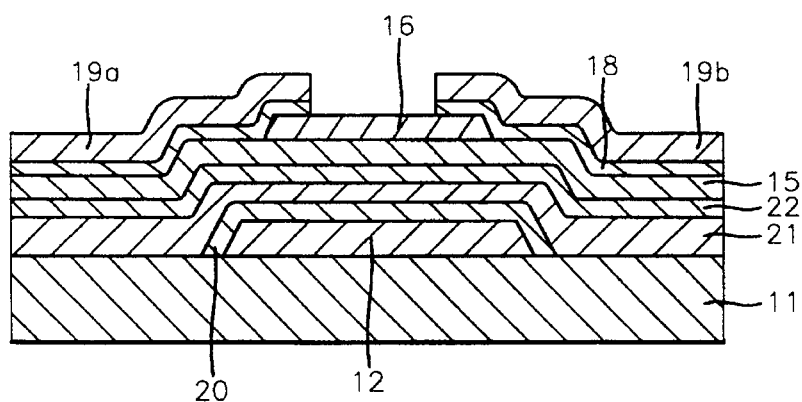
FIG.8a
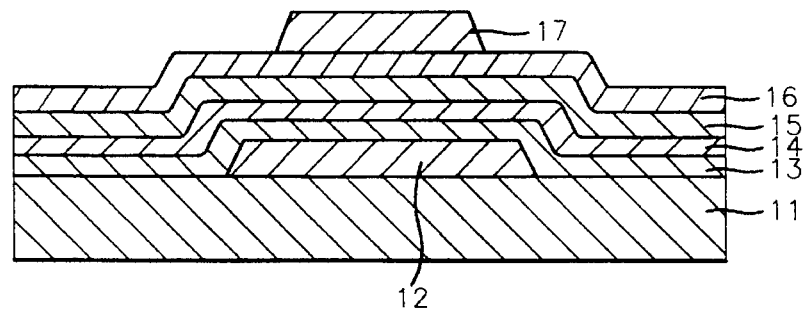

METHOD FOR FABRICATING THIN FILM TRANSISTOR USING BACK LIGHT EXPOSURE

BACKGROUND OF THE INVENTION

The present invention relates to a method for fabricating a thin film transistor, and more particularly to a method for fabricating a thin film transistor to be used as a switching element of a liquid crystal display device, enabling an easy fabrication and an improvement in device characteristic by use of a self-alignment.

Generally, thin film transistor-liquid crystal display (TFT-LCD) devices include a bottom plate formed with TFTs and pixel electrodes and a top plate formed with color filters and common electrodes. A liquid crystal is filled in a space defined between the upper plate and the lower plate. Polarizing plates for linearly polarizing visible rays are attached to opposed surfaces of the plates comprised of, for example, glass substrates, respectively.

FIG. 1a is a circuit diagram of an equivalent circuit of a general TFT-LCD array having the above-mentioned arrangement. FIG. 1b is a circuit diagram of an equivalent circuit of a unit pixel of the array shown in FIG. 1a.

As shown in FIG. 1a, the TFT-LCD device includes a plurality of gate signal lines $G_1$ to $G_n$ each arranged between neighboring pixel regions in one direction, a plurality of data signal lines $D_1$ to $D_n$ each arranged between neighboring pixel regions in a direction perpendicular to the direction of the gate signal lines, and a plurality of thin film transistors $Q_{11}$ to $Q_{nn}$ each disposed at each corresponding pixel region and adapted to apply data voltage from each corresponding one of the data lines $D_1$ to $D_n$ to each corresponding pixel electrode and liquid crystal in accordance with a signal from each corresponding one of the gate signal lines $G_1$ to $G_n$.

In each unit pixel of this TFT-LCD device, a capacitor $C_{STO}$ and an additional capacitor $C_{LC}$ are provided which are formed by virtue of the TFT serving as the switching element of the unit pixel and the liquid crystal present between the upper and lower plate electrodes.

In operation of the TFT-LCD device having the above-mentioned arrangement, a gate signal voltage is selectively applied to the TFT which is the switching element of each unit pixel. When the TFT receives the gate signal voltage, it is turned on so that data voltage carrying image information can be applied to the corresponding pixel electrode and the liquid crystal via the TFT for 2 hours.

As data voltage is applied to the TFT of each unit pixel, the arrangement of liquid crystal molecules is changed, resulting in a change in optical properties. As a result, an image is displayed.

In order to obtain high quality images in this TFT-LCD device, the display area for displaying an image, namely, the aperture ratio or the opening ratio should be large. Furthermore, the leakage current from the TFTs should be minimized.

For improving the aperture ratio, the area occupied by the TFT of each unit pixel should be reduced. This is because the region where the TFT of each unit pixel is formed can not display any image.

The data voltage which is applied to the pixel electrode of each unit pixel and the liquid crystal via the corresponding TFT has to be maintained for a predetermined time by the capacitors $C_{STO}$ and $C_{LC}$ provided by both the pixel electrode and the liquid crystal even when no gate signal voltage is applied.

In an ideal case, the total charge amount in the capacitors provided by the pixel electrode and the liquid crystal is maintained until a next signal is applied to the TFT which is at its turn-off state. In practical cases, however, a leakage of current occurs at the TFT. When such a leakage current is not sufficiently reduced, a distortion of liquid crystal voltage may occur, resulting in an occurrence of a flicker phenomenon.

Consequently, construction of TFTs is very important to achieve an improvement in aperture ratio and a decrease in leakage current both required for obtaining high quality images in TFT-LCD devices.

In other words, as the number of pixels is increased for obtaining a higher definition and a higher resolution in TFT-LCD devices, the dimension of each TFT should be reduced. Furthermore, the leakage current should be negligibly small.

Recently, research has been actively conducted to minimize the leakage current in small TFTs.

A conventional method for fabricating a TFT will be described in conjunction with FIGS. 2a to 2e.

This conventional method is used for fabricating an etch stopper type TFT.

In accordance with this method, an opaque metal layer made of Al, Ta or Cr is formed on an insulating transparent substrate 1 to provide a gate electrode 2, as shown in FIG. 2a. Over the entire exposed surface of the resulting structure, a gate insulating film 3, an amorphous silicon layer 4 and etch stopper layer 5 are sequentially deposited by a plasma enhanced chemical vapor deposition (PECVD) process. Thereafter, a photoresist film 9 is coated over the etch stopper layer 5.

Subsequently, the photoresist film 9 is subjected to a hard baking at a temperature of 110° C. Using the gate electrode 2 as a mask, the resulting structure is subjected at the lower surface of the substrate 1 to a back light exposure by use of the self-alignment technique, as shown in FIG. 2b.

In this back light exposure, the positive photoresist film 9 is etched by a developer at its portion receiving light beams while partially remaining at its portion not receiving light beams because of the opaque gate electrode 2, namely, disposed just above the gate electrode 2. The remaining photoresist portion. Serves as a photoresist pattern.

At this time, the backward incident light beams are refracted inward of the gate electrode 2 at edges of the gate electrode 2 due to their scattering and diffraction phenomenons. As a result, the photoresist pattern has a dimension smaller than that of the pattern of the gate electrode 2.

Using the patterned photoresist film 9 as a mask, the etch stopper layer 5 is selectively removed at its exposed portion, as shown in FIG. 2c. At this time, the overlap length ΔL between the gate electrode 2 and the etch stopper layer 5 is proportional to the energy of the incident light. For example, the overlap length ΔL is less than 1 μm at the incident light energy of 0.5 $J/cm^2$.

Thereafter, an, amorphous silicon layer 6 doped with high concentration n-type impurity ions and a metal layer 7 are sequentially deposited over the entire exposed surface of the resulting structure, as shown in FIG. 2d.

The high concentration n-type amorphous silicon layer 6 and the metal layer 7 are selectively removed at their portions disposed over the etch stopper layer 5 so as to form source and drain electrodes 7a and 7b, as shown in FIG. 2e. Thus a TFT is obtained.

The operation of the TFT fabricated in accordance with the conventional method will now be described.

When a voltage not lower than the threshold voltage is applied to the gate electrode 2, a channel is formed at the interface between the amorphous silicon layer 4 and the gate insulating film 3, thereby causing the source and the drain to be electrically communicated with each other.

However, this conventional method has the following problems.

In the TFT which is used as the switching element in LCD devices, as shown in FIG. 3, a channel is generally formed at the interface between the gate insulating film and the amorphous silicon (a-Si) layer. As a result, where no overlap is present between the gate electrode and the source/drain electrodes, an offset region is formed between the amorphous silicon layer and the source electrode, thereby causing the TFT not to operate. On the contrary, where the overlap length is excessively large, the TFT is enlarged in dimension, thereby resulting in a decrease in aperture ratio. In addition, a parasitic capacitance may be present between the gate electrode and the source/drain electrode. When the TFT is turned off, such a parasitic capacitance affects the liquid crystal voltage due to its capacitive coupling. As a result, the liquid crystal voltage is varied by $\Delta V$, thereby resulting in a degradation in picture quality.

It is, accordingly, preferred that the overlap length between the gate electrode and the source/drain electrode is one to two μm.

In the fabrication of TFTs in accordance with the conventional method, a back light exposure is carried out by utilizing the self-alignment technique under a condition that the single gate insulating film 3 has been formed and the gate electrode 2 is used as a mask. In this back light exposure, light beams are refracted inward of the gate electrode 2 at edges of the gate electrode 2 due to their scattering and diffraction phenomenons, as mentioned above. As a result, the overlap length of not less than one μm can not be obtained, even though the pattern of the photoresist film 9 is smaller than the pattern of the gate electrode 2. To obtain an increased overlap length, the light exposure should be performed using high energy for a long time.

However, such a light exposure shortens the life of the exposure equipment and lengthens the time of the exposure process step. As a result, the yield is decreased.

Since only the etch stopper layer is etched by the self-alignment technique in accordance with the conventional method, the amorphous silicon layer serving as an active layer of the TFT has a width larger than that of the gate electrode. As a result, back light enters the amorphous silicon layer in the operation of the TFT-LCD device, thereby causing electrons to be excited in the amorphous silicon layer. This causes an increase in leakage current.

In particular, where the conventional method is used in the fabrication of LCDs for over head projectors requiring the quantity of light being forty times or above as large as those of LCDs for office automation, the leakage current is more increased while the ON/OFF ratio of TFT is decreased. As a result, a flicker phenomenon occurs, resulting in a degradation in LCD performance.

SUMMARY OF THE INVENTION

Therefore, an object of the invention is to solve the above-mentioned problems encountered in the prior art and to provide a method for fabricating a TFT capable of adjusting an overlap length up to two μm or above by use of a full self alignment and reducing the width of a semiconductor layer to the width of a gate electrode or below, providing improved in TFT-LCD performance and a simplified fabrication.

In accordance with the present invention, this object can be accomplished by providing a method for fabricating a thin film transistor, comprising the steps of: forming a gate electrode on an insulating transparent substrate; stacking a plurality of gate insulating films having different refractive indices, in the order of lower refractive index, over the entire exposed surface of the resulting structure after the formation of said gate electrode, and then sequentially depositing a semiconductor layer, an etch stopper layer and a photoresist film, in this order, over the entire exposed surface of the resulting structure after the formation of said gate insulating films; subjecting the resulting structure to a back light exposure using said gate electrode as a mask and then to a development for patterning said photoresist film so that the gate electrode can be overlapped by a predetermined overlap length with each of a source electrode and a drain electrode to be formed at a subsequent step; selectively etching said etch stopper layer using said patterned photoresist film as a mask; removing the patterned photoresist film and then sequentially depositing a high concentration n type doped semiconductor layer and a metal layer over the entire exposed surface of the resulting structure; and selectively removing the respective portions of said high concentration n-type doped semiconductor layer and said metal layer disposed over the patterned etch stopper layer to form said source electrode and said drain electrode.

BRIEF DESCRIPTION OF THE DRAWINGS

Other objects and aspects of the invention will become apparent from the following description of embodiments with reference to the accompanying drawings in which:

FIG. 1b is a circuit diagram of an equivalent circuit of a unit pixel of the array shown in FIG. 1a;

FIG. 6 is a table illustrating refractive indices of various insulating materials;

FIG. 7 is a sectional view illustrating a method for fabricating a TFT in accordance with a second embodiment of the present invention;

FIGS. 8a to 8d are sectional views respectively illustrating a method for fabricating a TFT in accordance with a third embodiment of the present invention;

DETAILED DESCRIPTION OF THE PREFERRED EMBODIMENTS

FIGS. 4a to 4f are sectional views respectively illustrating a method for fabricating a TFT in accordance with a first embodiment of the present invention.

Figure 1A:
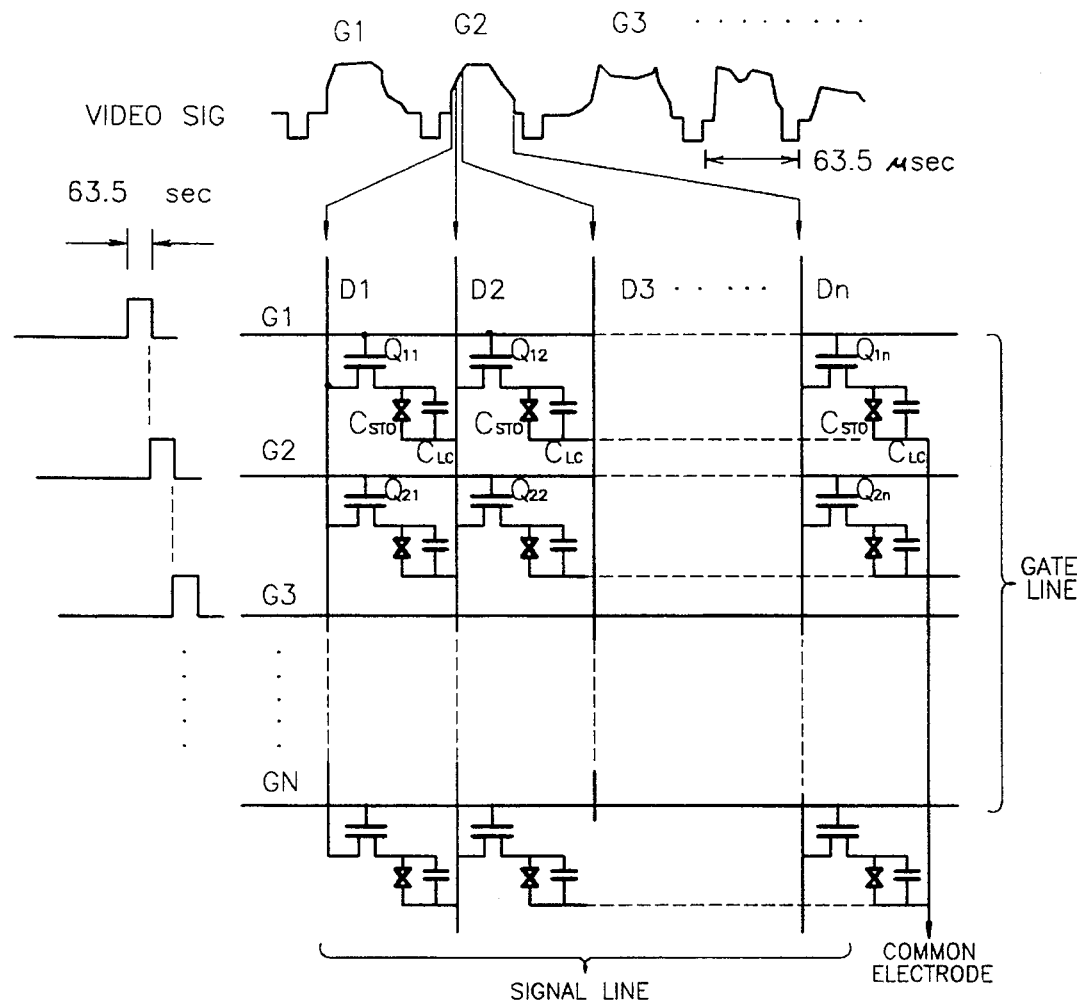
FIG. 1a is a circuit diagram of an equivalent circuit of a general TFT-LCD array.
Figure 1B:
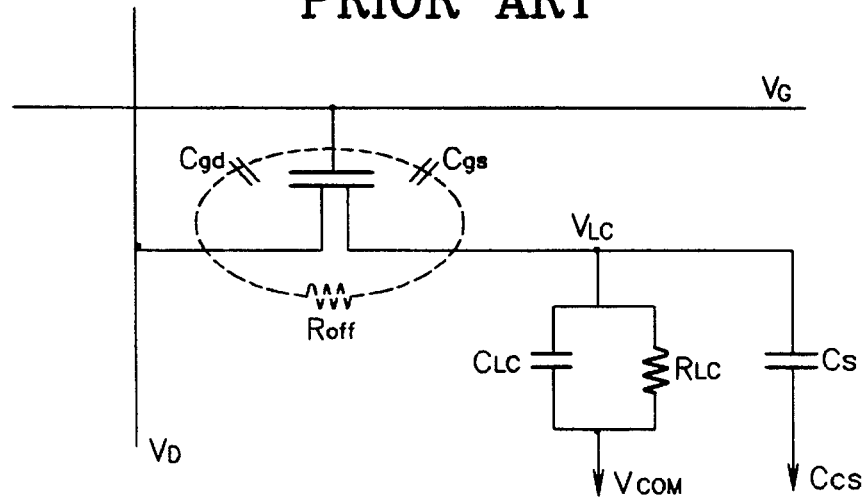
Figure 2A:
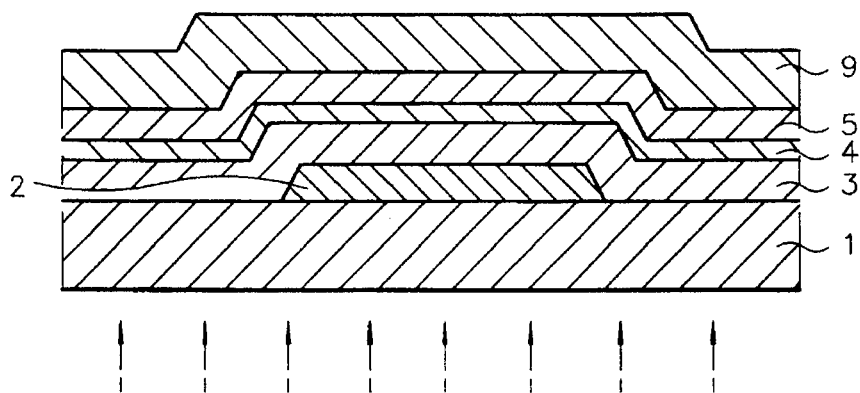
FIGS. 2a to 2e are sectional views respectively illustrating a conventional method for fabricating a TFT.
Figure 2B:
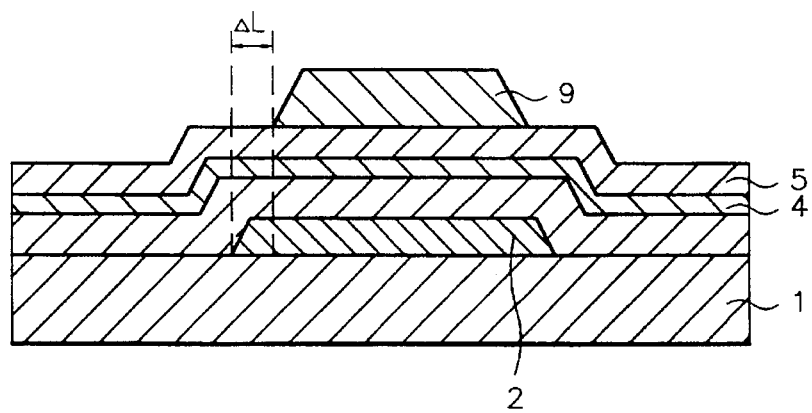
Figure 2C:
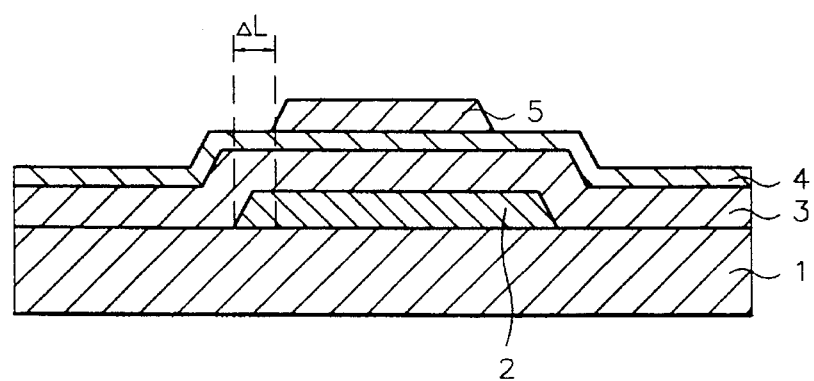
Figure 2D:
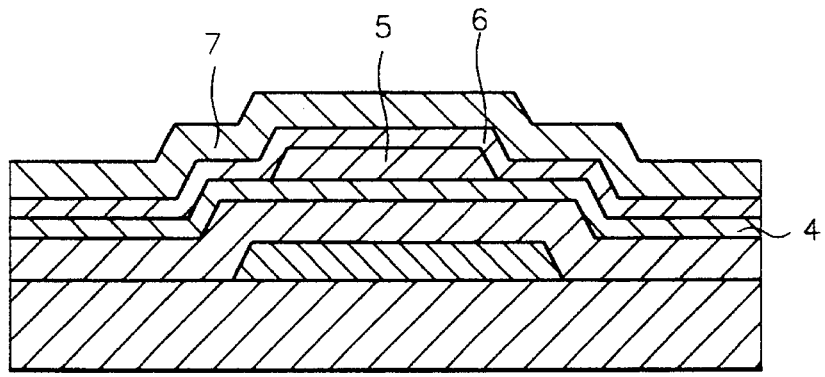
Figure 2E:
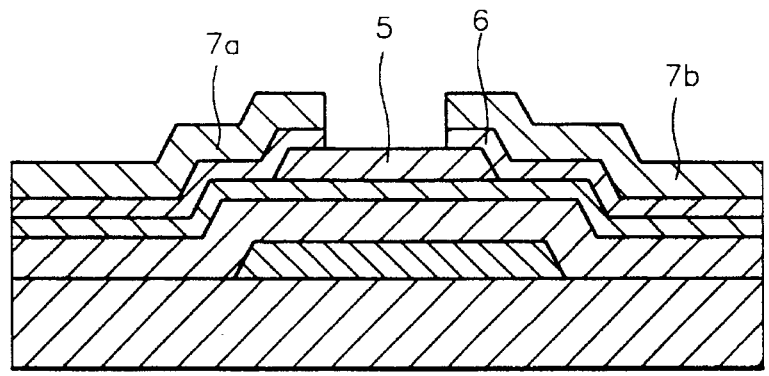
Figure 3:
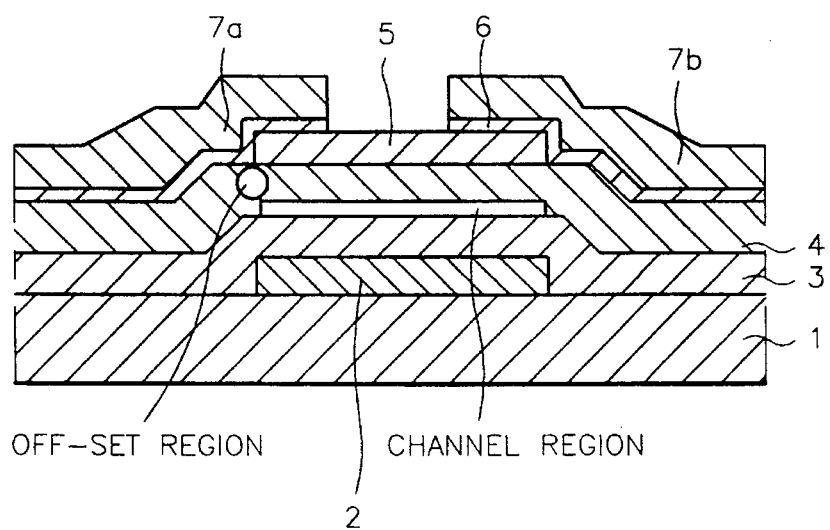
FIG. 3 is a schematic sectional view explaining problems encountered in TFTs fabricated in accordance with the conventional method.
Figure 4A:
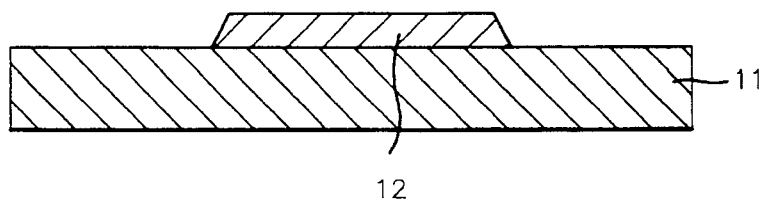
FIGS. 4a to 4f are sectional views respectively illustrating a method for fabricating a TFT in accordance with a first embodiment, of the present invention.

In accordance with the first embodiment, an opaque metal layer made of Al, Cr, Ta or Ti is formed on an insulating transparent substrate 11 and then patterned to provide a gate electrode 12, as shown in FIG. 4a.

Figure 4B:
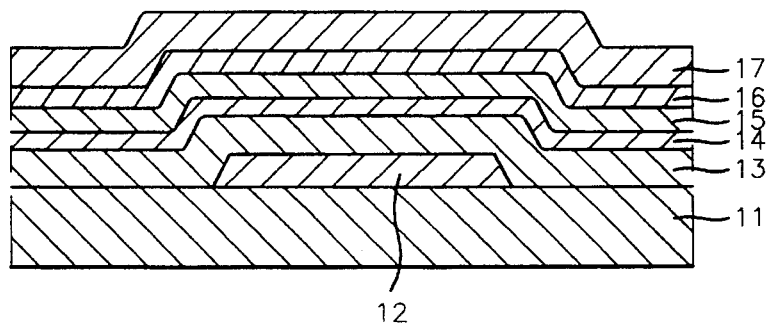

Over the entire exposed surface of the resulting structure, a first gate insulating film 13 having a high refractive index and a second gate insulating film 14 having a low refractive index are sequentially deposited, as shown in FIG. 4b. Preferably, the first gate insulating film 13 has a refractive index of more than two whereas the second gate insulating film 14 has a refractive index of not more than two. By referring to FIG. 6 showing refractive indices of various insulating materials, $Ta_2O_5$ and $TiO_2$ exhibiting a refractive index of more than two may be used for the first gate insulating film 13 while $Al_2O_3$, $SiO_2$ and $SiO_xN_y$ may be used for the second gate insulating film 14. By virtue of this difference in the refractive index between the gate insulating films 13 and 14, it is possible to obtain an overlap length of about two µm, as will be described hereinafter.

Where the first gate insulating film 13 is comprised of a $Ta_2O_5$ insulating film formed by the anodic oxidation, its refractive index can be adjusted within a range of 2 to 2.7, depending on the used condition.

Subsequently, a semiconductor layer 15, an etch stopper layer 16 and a photoresist film 17 are sequentially deposited over the second gate insulating film 14. The semiconductor layer 15 may be made of polysilicon or amorphous silicon. The etch stopper layer 16 is made of $SiN_x$.

Figure 4C:
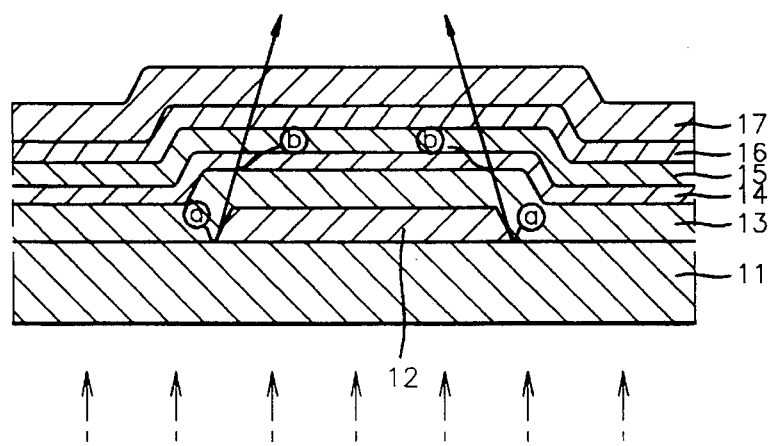

Using the gate electrode 12 as a mask, the resulting structure is then subjected to a back light exposure by use of the self-alignment technique, as shown in FIG. 4c. In this back light exposure, incident light beams are refracted inward of the gate insulating films 13 and 14.

Figure 5:
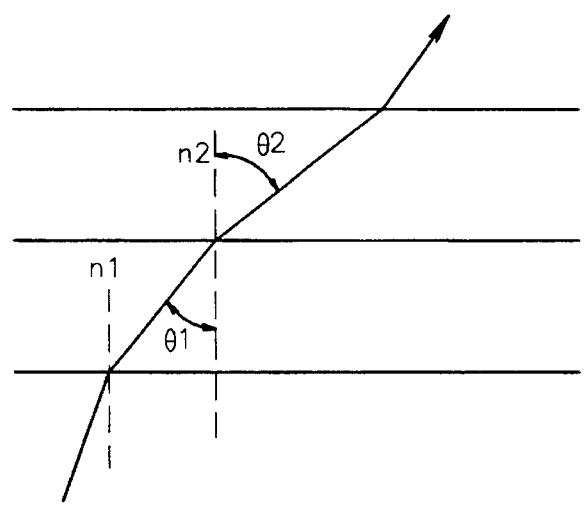
FIG. 5 is a schematic view showing a path of light passing through different mediums.

FIG. 5 shows a path of light passing through different mediums. An optical path defined in two mediums having different refractive indices $n_1$ and $n_2$ can be represented by the following equation according to Snell's law:

$$n_1 \sin\theta_1 = n_2 \sin\theta_2 \qquad (1)$$

wherein, $\theta_1$: travel angle of light passing through the medium of $n_1$;

$\theta_2$: travel angle of light passing through the medium of $n_2$.

In case of $n_1 > n_2$, $\theta_1$ is smaller than $\theta_2$. On the contrary, $\theta_1$ is greater than $\theta_2$ in case of $n_1 < n_2$.

Accordingly, where the first gate insulating film 13 and the second gate insulating film 14 are made of a material having a high refractive index and a material having a low refractive index, respectively, as mentioned above, incident light beams at the back light exposure step are refracted inward of the gate electrode 12 at the portions "a" of first gate insulating film 13 disposed at edges of the gate electrode 12 due to their refraction phenomenon. Also at the interface portions "b" between the first gate insulating film 13 and the second gate insulating film 14, the incident light beams are more refracted inward of the gate electrode 12. As a result, the photoresist film 17 is exposed to the light such that an increased overlap length is obtained.

Figure 4D:
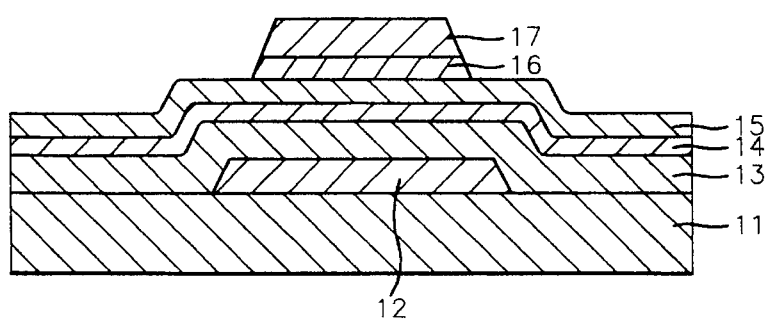

Thereafter, the light-exposed photoresist film 17 is developed and patter so that it remains only over the gate electrode 12 to form a photoresist film pattern, as shown in FIG. 4d. Using the patterned photoresist film 17 as a mask, the etch stopper layer 16 is then selectively removed at its portion exposed after the patterning of the photoresist film 17. Thereafter, the photoresist film 17 is removed.

Figure 4E:
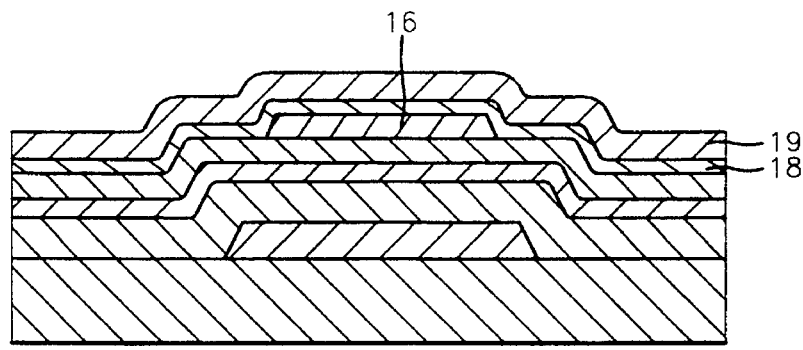

Over the entire exposed surface of the resulting structure, a semiconductor layer 18 doped with high concentration n-type impurity ions and a metal layer 19 are sequentially deposited, as shown in FIG. 4e.

Figure 4F:
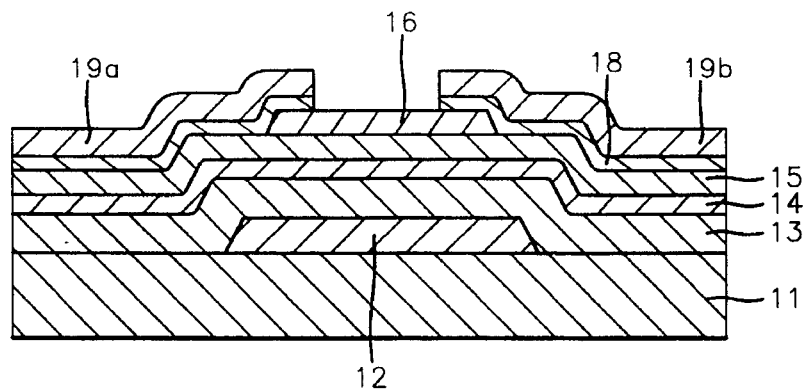

The high concentration n-type doped semiconductor layer 18 and the metal layer 19 are selectively removed at their portions disposed over the etch stopper layer 16 so as to form source and drain electrodes 19a and 19b, as shown in FIG. 4f. Thus a TFT is obtained.

On the other hand, FIG. 7 is a schematic sectional view illustrating a method for fabricating a TFT in accordance with a second embodiment of the present invention. This second embodiment is similar to the first embodiment, except for the use of a triple gate insulating film structure including three gate insulating films having different refractive indices. In FIG. 7, elements corresponding to those in FIGS. 4a to 4f are denoted by the same reference numerals.

In accordance with the second embodiment, an opaque metal layer made of Al, Cr, Ta or Ti is formed on an insulating glass substrate 11 and then patterned to provide a gate electrode 12.

Over the gate electrode 12, a first gate insulating film 20 made of $Ta_2O_5$ or $TiO_2$ having a refractive index of more than two is formed by the anodic oxidation process. Over the entire exposed surface of the resulting structure, a second gate insulating film 21 made of a material such as $SiO_2$ having a refractive index of one to two and a third gate insulating film 22 made of a material having a refractive index of greater than one but less than that of the second gate insulating film are sequentially deposited. Subsequently, a semiconductor layer 15, an etch stopper layer 16 and a photoresist film 17 are sequentially deposited over the third insulating film 22. Using the gate electrode 12 as a mask, the resulting structure is then subjected to a back light exposure by use of the self-alignment technique in a manner as described in conjunction with FIG. 4c. Thereafter, a development is carried out for patterning the photoresist film 17. Subsequent steps for fabricating a TFT are the same as those of the first embodiment.

The thickness of each of the gate insulating films 20, 21 and 22 is not less than 1,000 Å.

Alternatively, the third gate insulating film 22 having the refractive index of greater than one may have a thickness of less than 1,000 Å, while the first gate insulating film 20 having the refractive index of more than two and the second gate insulating film 21 having the refractive index of one to two have a thickness of not less than 1,000 Å. Even in the latter case, the same effect as that in the former case can be obtained after the back light exposure. In the latter case, it is preferable to use a $SiO_2$ film as the second gate insulating film having the refractive index of one to two and the thickness of not less than 1,000 Å and a $SiN_x$ film as the third gate insulating film having the refractive index of one to two and the thickness of less than 1,000 Å.

FIGS. 8a to 8d are sectional views respectively illustrating a method for fabricating a TFT in accordance with a third embodiment of the present invention. This method utilizes the self-alignment technique for achieving a back exposure and the photolithography and etching process for achieving a simultaneous patterning of both an etch stopper layer and a semiconductor layer. In FIGS. 8a to 8d, elements corresponding to those in FIGS. 4a to 4f are denoted by the same reference numerals.

In accordance with the third embodiment, an opaque metal layer is formed on an insulating transparent substrate 11 and then patterned to provide a gate electrode 12, as shown in FIG. 8a. Over the entire exposed surface of the resulting structure, a first gate insulating film 13 having a high refractive index and a second gate insulating film 14 having a low refractive index are sequentially deposited. Subsequently, a semiconductor layer 15, an etch stopper layer 16 and a photoresist film 17 are sequentially deposited over the second gate insulating film 14. The semiconductor layer 15 may be made of polysilicon or amorphous silicon. The etch stopper layer 16 is made of $SiN_x$. Using the gate electrode 12 as a mask, the resulting structure is then subjected to a back light exposure by use of the self-alignment technique in a manner as described in conjunction with FIG. 4c. Thereafter, a development is carried out for patterning the photoresist film 17 such that the photoresist film 17 can have a sufficient overlap.

Figure 8B:
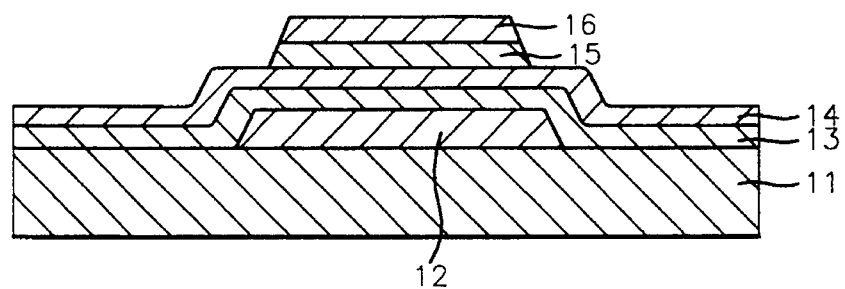

Using the patterned photoresist film 17 as a mask, both the etch stopper layer 16 and the semiconductor layer 15 are then selectively subjected to a taper etching so as to remove their portions exposed after the patterning of the photoresist film 17, as shown in FIG. 8b, at a taper angle of not more than 20° for example. Of course, a vertical etching may be used for the removal of the exposed portions of the layers 15 and 16. Thereafter, the photoresist film 17 is removed.

The taper etching is achieved by wet etching the etch stopper layer 16 using a buffered oxide etchant (BOE) solution and then dry etching the semiconductor layer 15 using an etching gas of $CF_4+O_2$ or $C_2ClF_5+O_2$. Where the semiconductor layer 15 is comprised of an amorphous silicon layer, the taper etching may be achieved at a taper angle of not more than 20° using an etching gas of $C_2ClF_5 : O_2 = 5 : 4$.

Alternatively, both the etch stopper layer 16 and the semiconductor layer 15 are patterned by the dry etching process. Where the etch stopper layer 16 and the semiconductor layer 15 are comprised of a $SiN_x$ layer and an amorphous silicon layer, respectively, they can be simultaneously taper-etched using an etching gas of $C_2ClF_5 : SF_6 : O_2 = 6 : 4 : 3$.

Figure 8C:
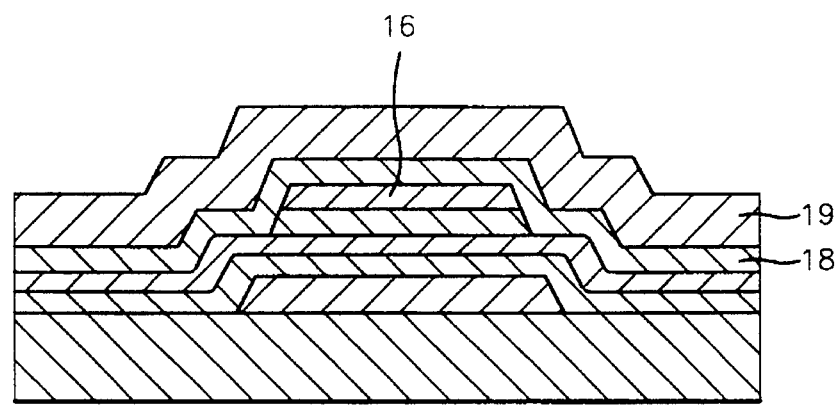
Figure 8D:
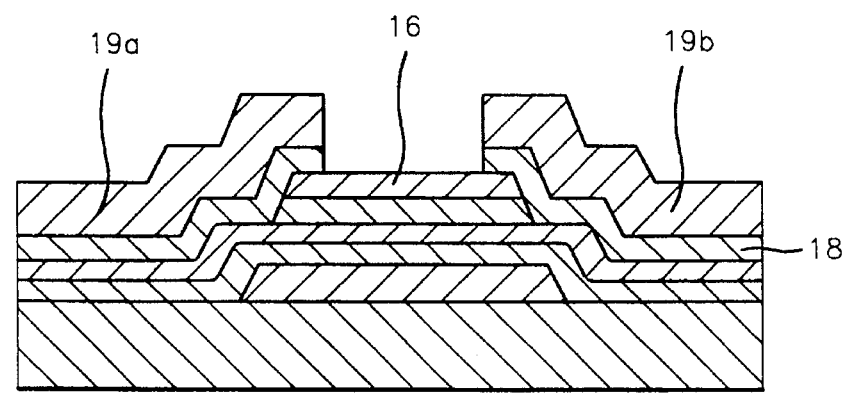

Thereafter, a high concentration n-type doped semiconductor layer 18 and a metal layer 19 are sequentially deposited over the entire exposed surface of the resulting structure, as shown in FIG. 8c. The high concentration n-type doped semiconductor layer 18 and the metal layer 19 are selectively removed at their portions disposed over the etch stopper layer 16 so as to form source and drain electrodes 19a and 19b, as shown in FIG. 4f. Thus a TFT is obtained.

In this a TFT fabricated in accordance with the third embodiment, the semiconductor layer 15 serving as an active layer of the TFT has a width smaller than that of the gate electrode 12.

FIGS. 9a to 9d fare sectional views respectively illustrating a method for fabricating a TFT in accordance with a fourth embodiment of the present invention. In accordance with this method, the taper etching shown in FIGS. 8a and 8b is used for patterning both an etch stopper layer and a semiconductor layer. An exposed portion of the semiconductor layer is implanted with high concentration n-type impurity ions to form a high concentration n-type doped semiconductor layer. In accordance with this method, a silicide layer is also formed to reduce a contact resistance at an interface between the high concentration n-type doped semiconductor layer and a metal layer subsequently deposited. In FIGS. 9a to 9d, elements corresponding to those in FIGS. 4a to 4f are denoted by the same reference numerals.

Figure 9A:
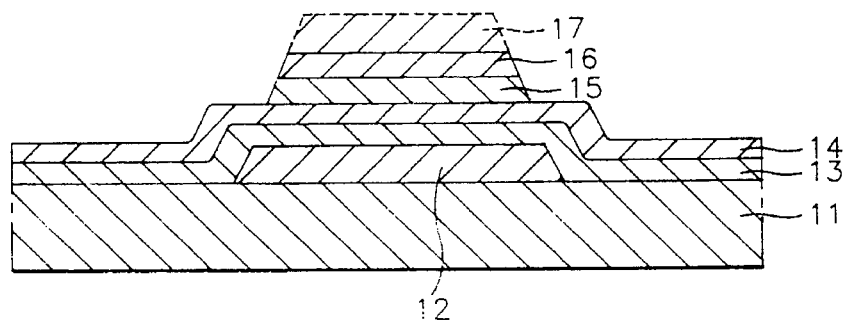
FIGS. 9a to 9d are sectional views respectively illustrating a method for fabricating a TFT in accordance with a fourth embodiment of the present invention.

In accordance with the fourth embodiment, an opaque metal layer is formed on an insulating substrate 11, and then patterned to provide a gate electrode 12, as shown in FIG. 9a. Over the entire exposed surface of the resulting structure, a first gate insulating film 13 having a high refractive index and a second gate insulating film 14 having a low refractive index, a semiconductor layer 15, an etch stopper layer 16 and a photoresist film 17 are sequentially deposited. Using the gate electrode 12 as a mask, the resulting structure is then subjected to a back light exposure by use of the self-alignment technique. Thereafter, a development is carried out for patterning the photoresist film 17.

Using the patterned photoresist film 17 (indicated by the phantom line in FIG. 9a) as a mask, both the etch stopper layer 16 and the semiconductor layer 15 are then selectively etched. Thereafter, the photoresist film 17 is removed.

Figure 9B:
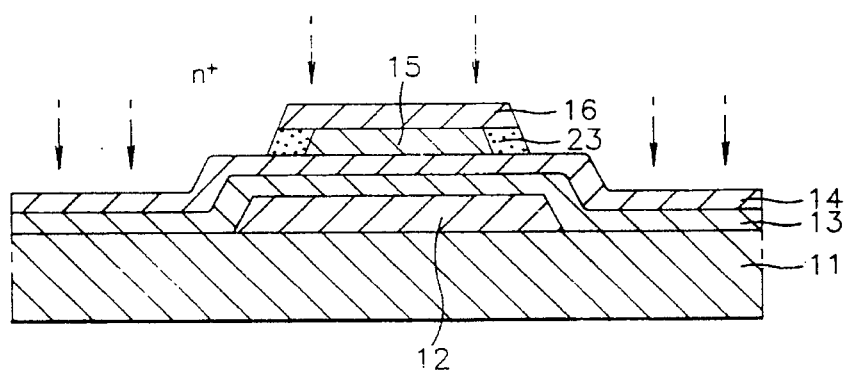

High concentration n-type impurity ions are implanted in both exposed side surfaces of the patterned semiconductor layer 15 to form high concentration n-type doped semiconductor layers 23, as shown in FIG. 9b. The ion implantation is carried out without using any additional masking process, but simply using the patterned etch stopper layer 16 as a mask.

In the ion implantation, phosphorous ions are implanted using $PH_3$ gas and $H_2$ gas.

Figure 9C:
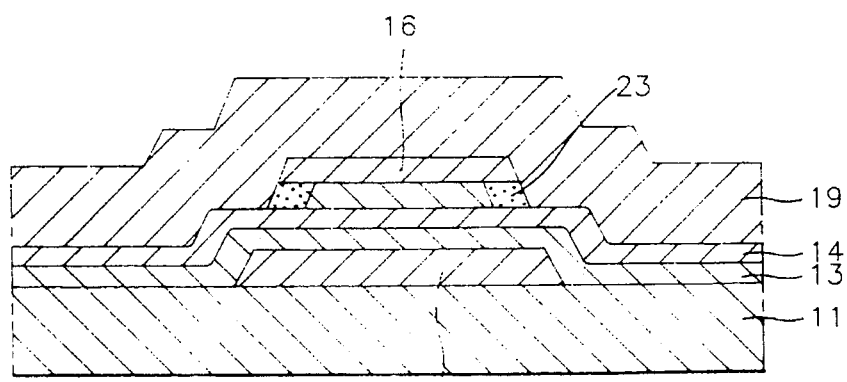
Figure 9D:
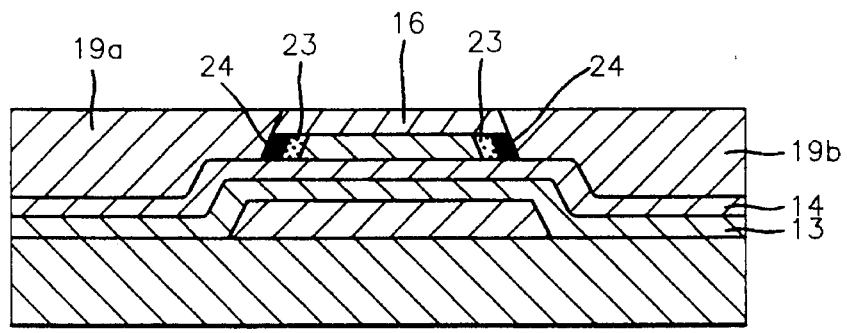

Thereafter, a high-melting metal layer 19 made of a metal such as Cr or Mo having a high melting point is deposited over the entire exposed surface of the resulting structure and then subjected to an annealing, as shown in FIG. 9c. During the annealing step, the high-melting metal layer 19 reacts with the high-concentration n-type doped semiconductor layers 23, thereby forming silicide layers 24 at their interfaces, ,respectively, as shown in FIG. 9d. Where the high-melting metal layer 19 is made of Cr, a silicide in the form of $CrSi_x$ is produced. On the other hand, a silicide in the form of $MoSi_x$ is formed where Mo is used. Finally, the high-melting metal layer 19 is selectively removed at portions thereof disposed over the etch stopper layer 16 so as to form source and drain electrodes 19a and 19b. Thus a TFT is obtained.

In accordance with the fourth embodiment, the etch stopper layer, the semiconductor layer pattern and the high concentration n-type doped semiconductor layers are formed by the full self alignment technique. Accordingly, the fabrication is simplified.

FIGS. 10a to 10f are sectional views respectively illustrating a method for fabricating a TFT in accordance with a fifth embodiment of the present invention. In accordance with this method, two independent patterning steps are carried out for an etch stopper layer and a semiconductor layer, in place of the above-mentioned simultaneous patterning. An ion implantation is carried out for forming a high concentration n-type doped semiconductor layer. In accordance with this method, a silicide layer is also formed. In FIGS. 10a to 10f, elements corresponding to those in FIGS. 4a to 4f are denoted by the same reference numerals.

Figure 10A:
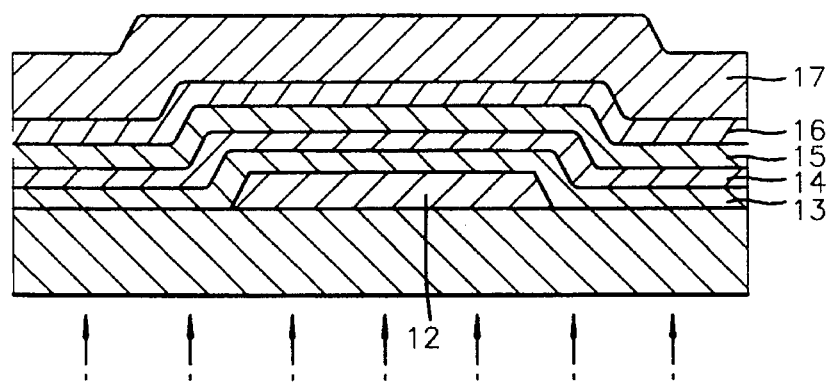
FIGS. 10a to 10f are sectional views respectively illustrating a method for fabricating a TFT in accordance with a fifth embodiment of the present invention.

In accordance with the fifth embodiment, an opaque metal layer is formed on an insulating transparent substrate 11 and then patterned to provide a gate electrode 12, as shown in FIG. 10a. Over the entire exposed surface of the resulting structure, a first gate insulating film 13 having a high refractive index and a second gate insulating film 14 having a low refractive index, a semiconductor layer 15, an etch stopper layer 16 and a first photoresist film 17 are sequentially deposited.

Figure 10B:
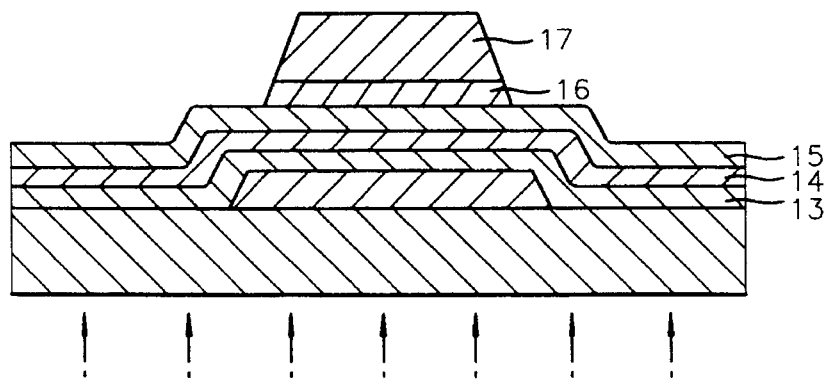

Using the gate electrode 12 as a mask, the resulting structure is then subjected to a back light exposure by use of the self-alignment technique. Thereafter, a development is carried out for patterning the first photoresist film 17, as shown in FIG. 10b. Using the patterned photoresist film 17 as a mask, the etch stopper layer 16 is then selectively etched. Thereafter, the first photoresist film 17 is removed.

Figure 10C:
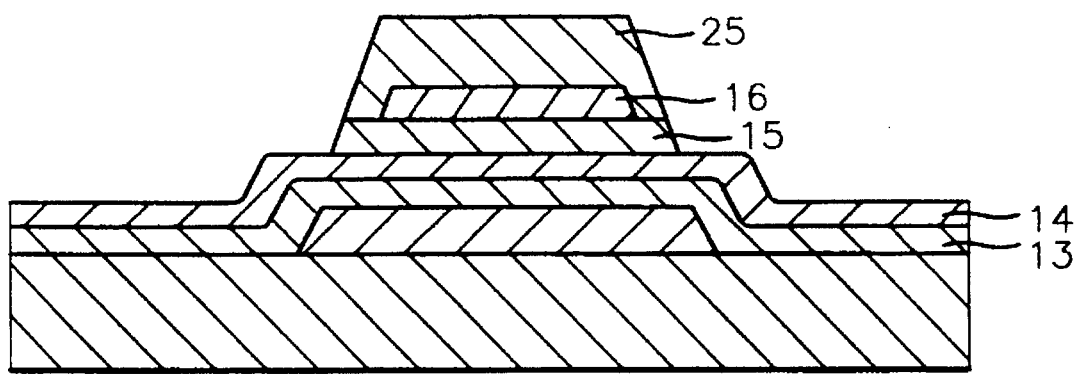

Over the entire exposed surface of the resulting structure, a second photoresist film 25 is then deposited, as shown in FIG. 10c. Using the gate electrode 12 as a mask, the resulting structure is then subjected to a back light exposure by use of the self-alignment technique. Thereafter, a development is carried out for patterning the second photoresist film 25. Using the patterned photoresist film 25 as a mask, the semiconductor layer 15 is then selectively etched.

After completion of the patterning steps, the patterned semiconductor layer 15 should have a width larger than that of the etch stopper layer 16, but smaller than that of the gate electrode 12. To this end, the light exposure for the first photoresist film 17 is carried out using a higher energy (power×time) than that used for the second photoresist film 25. Alternatively, linearly polarized light is incident on the substrate 11 at an angle of 45° in the light exposure for the first photoresist film 17 and at an angle of 90° in the light exposure for the second photoresist film 25. Accordingly, the photoresist films 17 and 25 can be patterned to have different widths. By Using the photoresist films 17 and 25 patterned in the above-mentioned manner, the semiconductor layer 15 is patterned to have a width larger than that of the etch stopper layer 16, but smaller than that of the gate electrode 12.

Figure 10D:
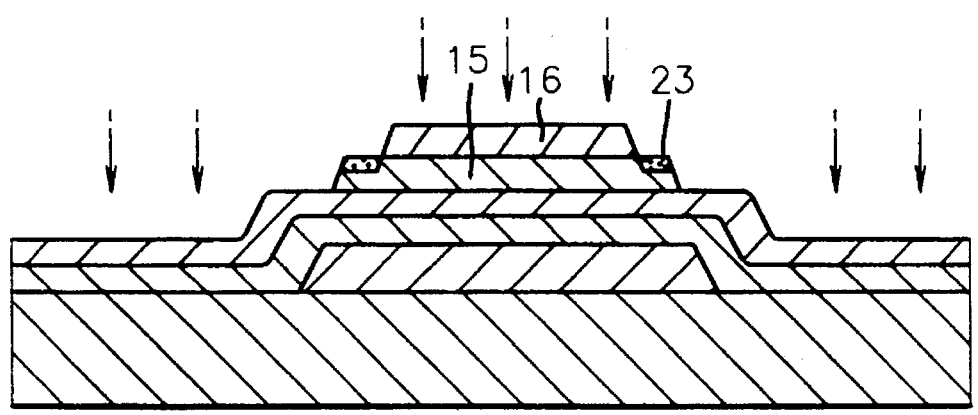

Then, the second photoresist film 25 is removed, as shown in FIG. 10d. Using the etch stopper layer 16 as a mask, high concentration n-type impurity ions are implanted in both exposed lateral end portions of the patterned semiconductor layer 15 to form high concentration n-type doped semiconductor layers 23.

Figure 10E:
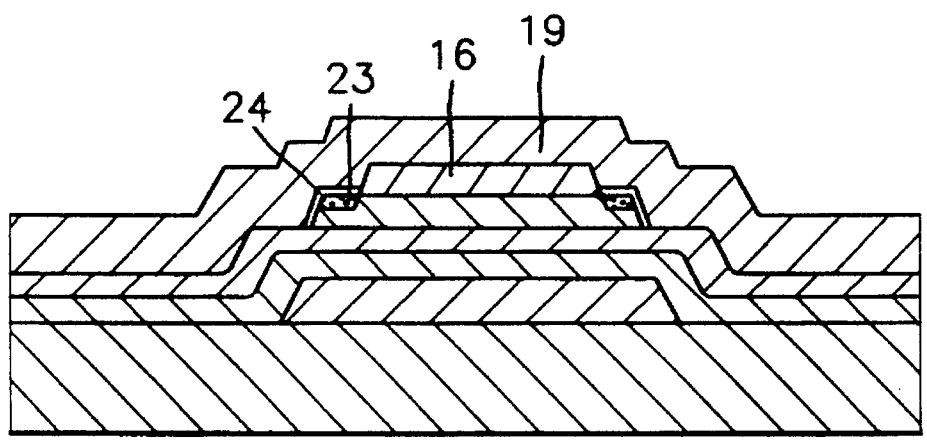
Figure 10F:
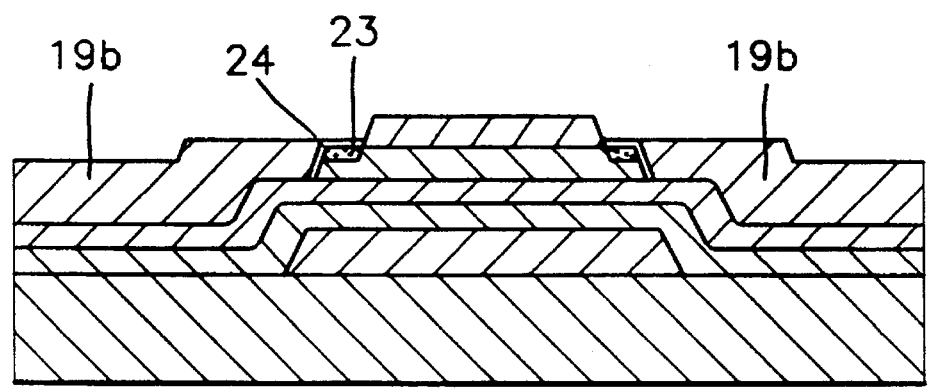

Thereafter, a high-melting metal layer 19 made of a metal such as Cr or Mo is deposited over the entire exposed surface of the resulting structure and then subjected to an annealing, as shown in FIG. 10e. During the annealing step, the high-melting metal layer 19 reacts with the semiconductor layers 15 and 23, thereby forming silicide layers 24 at regions where the high-melting metal layer 19 is in contact with the semiconductor layers 15 and 23, respectively. The silicide of each layer 24 is a reaction product resulting from the reaction between the metal layer 19 and each of the semiconductor layers 15 and 23 and has an etch selectivity higher than those of the metal layer 19 and the semiconductor layers 15 and 23.

Finally, the high-melting metal layer 19 is selectively removed at their portions disposed over the etch stopper layer 16 so as to form source and drain electrodes 19a and 19b. Thus a TFT is obtained.

In order to remove only the portion of metal layer 19 disposed over the etch stopper layer 16, as mentioned above, a photoresist film mask for exposing only the metal layer portion disposed over the etch stopper layer 16 may be formed using another photoresist film. Then, the exposed metal layer portion is selectively removed using the photoresist film mask. In this case, a larger margin is provided, as compared to the photolithography process. This is because the silicide layer 24 formed at the interface between the metal layer 19 and each of the semiconductor layers 15 and 23 serves as an etching stop even when a slight misalignment occurs in formation of the photoresist film mask. In this case, the source and drain electrodes 19a and 19b may be directly formed without formation of the silicide layers 24.

The above-mentioned methods of the present invention have the following effects:

First, a sufficient overlap length is obtained because the overlap length can be adjusted up to 2 μm or above by utilizing a refractive index difference of two or three gate insulating films having different refractive indices. As a result, an improvement in yield is achieved;

Second, the leakage current due to back light is reduced to a minimum because the semiconductor layer has a width smaller than that of the gate electrode. Since the silicide layer is formed between the semiconductor layer and the metal layer, it is possible to reduce the contact resistance and thus improve the device characteristic;

Third, a simplified fabrication and an improved yield is achieved because the high concentration n-type doped semiconductor layer is formed by an implantation of n-type impurity ions using the self-alignment process; and Fourth, an improved picture quality of LCD is obtained when the TFT fabricated in accordance with one of the above-mentioned methods is used as a switching element of LCD.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a thin film transistor, comprising the steps of:

forming a gate electrode on an insulating transparent substrate to produce a first resulting structure;

stacking a plurality of gate insulating films having different refractive indices over a surface of the first resultant structure to produce a second resultant structure, the refractive index being higher as a gate insulating film is closer to the insulating transparent substrate;

sequentially depositing a semiconductor layer, an etch stopper layer, and a first photoresist film over a surface of the second resultant structure to produce a third resultant structure;

exposing the third resulting structure to a first back light using said gate electrode as a mask and patterning said first photoresist film so that the patterned first photoresist film has a width smaller than a width of the gate electrode;

etching and patterning the etch stopper layer using the patterned first photoresist film as a mask and then removing the patterned first photoresist film to produce a fourth resultant structure;

depositing a second photoresist film over a surface of the fourth resulting structure to produce a fifth resultant structure;

exposing the fifth resulting structure to a second back light using the gate electrode as a mask to produce a sixth resultant structure;

developing the sixth resulting structure and patterning the second photoresist film so that the patterned second photoresist film has a width smaller than the width of the gate electrode, and larger than a width of the patterned etch stopper layer;

etching the semiconductor layer using the patterned second photoresist film as a mask and then removing the patterned second photoresist film;

implanting high concentration impurity ions on a surface of the semiconductor layer using the patterned etch stopper layer as a mask to produce a seventh resultant structure;

depositing a metal layer over a surface of the seventh resulting structure;

annealing the metal layer to form a silicide layer at an interface between the metal layer and the semiconductor layer; and selectively removing a portion of the metal layer disposed over the patterned etch stopper layer to form a source electrode and a drain electrode.

2. A method in accordance with claim 1, wherein said first back light exposure and said second back light exposure are carried out under a condition that the light energy used in the first back light exposure is higher than that used in the second back light exposure so that said semiconductor layer can be patterned to have a width larger than that of said patterned etch stopper layer, but smaller than that of the gate electrode.

3. A method in accordance with claim 1, wherein linearly polarized light is incident on said substrate at an angle of 45° in the first back light exposure and at an angle of 90° in the second back light exposure.

4. A method in accordance with claim 1, wherein the high concentration impurity ions in the implanting step are n-type ions.

5. A method for fabricating a thin film transistor, comprising the steps of:

(a) forming a gate electrode on an insulating transparent substrate to produce a first resultant structure;

(b) stacking a plurality of gate insulating films having different refractive indices over a surface of the first resulting structure to produce a second resultant structure to direct light beams incident through the transparent substrate inwardly toward one another;

(c) depositing sequentially a semiconductor layer, an etch stopper layer, and a photoresist film, over a surface of the second resulting structure to produce a third resulting structure;

(d) using the gate electrode as a mask, exposing the third resulting structure to a back light to produce a fourth resulting structure;

(e) developing the fourth resulting structure to pattern the photoresist film;

(f) using the patterned photoresist film as a mask, selectively taper-etching the etch stopper layer and the semiconductor layer, the semiconductor layer having a width smaller than a width of the gate electrode;

(g) implanting high concentration impurity ions at exposed side surfaces of the taper-etched semiconductor layer to form doped semiconductor layers to produce a fifth resulting structure;

(h) depositing a high-melting point metal layer over a surface of the fifth resulting structure;

(i) annealing the high-melting point metal layer to form a silicide layer at an interface between the metal layer and each of the doped semiconductor layers; and (j) selectively removing portions of the doped semiconductor layers and the metal layer disposed over the patterned etch stopper layer to form a source electrode and a drain electrode.

6. A method in accordance with claim 5, wherein step (g) includes implanting phosphorous ions using a $PH_3$ gas and an $H_2$ gas.

7. A method in accordance with claim 5, wherein the high-melting point metal layer in step (h) includes at least one of Cr and Mo.

8. A method in accordance with claim 5, wherein the taper etching step is carried out at a taper angle of no more than 20°.

9. A method in accordance with claim 5, wherein the source and drain electrodes are formed of silicide.

10. A method in accordance with claim 5, wherein the doped semiconductor layer is doped with n-type ions.

* * * * *